(12) United States Patent
Gu et al.

(10) Patent No.: US 11,664,419 B2
(45) Date of Patent: May 30, 2023

(54) ISOLATION METHOD TO ENABLE CONTINUOUS CHANNEL LAYER

(71) Applicant: Applied Materials, Inc., Santa Clara, CA (US)

(72) Inventors: Sipeng Gu, Gloucester, MA (US); Wei Zou, Gloucester, MA (US); Kyu-Ha Shim, Gloucester, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/065,065

(22) Filed: Oct. 7, 2020

(65) Prior Publication Data

US 2022/0109045 A1  Apr. 7, 2022

(51) Int. Cl.
*H01L 29/06* (2006.01)
*H01L 21/762* (2006.01)

(52) U.S. Cl.
CPC .... *H01L 29/0653* (2013.01); *H01L 21/76243* (2013.01)

(58) Field of Classification Search
CPC .............. H01L 29/0653; H01L 21/76243
See application file for complete search history.

(56) References Cited

U.S. PATENT DOCUMENTS

| | | | | |
|---|---|---|---|---|
| 4,997,786 A * | 3/1991 | Kubota | ............. | H01L 21/76243 438/480 |
| 5,302,840 A * | 4/1994 | Takikawa | ............ | H01L 29/7783 257/11 |
| 5,955,767 A * | 9/1999 | Liu | .................... | H01L 21/76264 257/369 |
| 6,069,054 A * | 5/2000 | Choi | ................. | H01L 21/76213 438/528 |
| 6,127,242 A * | 10/2000 | Batra | ................ | H01L 21/76202 438/440 |
| 6,235,607 B1* | 5/2001 | Ibok | .................. | H01L 21/76213 438/528 |
| 6,258,693 B1* | 7/2001 | Choi | ................. | H01L 21/76213 438/528 |
| 6,287,901 B1* | 9/2001 | Christensen | ........ | H01L 29/7841 438/300 |
| 6,429,099 B1* | 8/2002 | Christensen | ...... | H01L 21/76267 257/E21.538 |
| 6,486,043 B1* | 11/2002 | Hannon | ............ | H01L 21/76264 438/479 |
| 6,686,255 B2* | 2/2004 | Yang | ................. | H01L 21/76213 438/424 |

(Continued)

*Primary Examiner* — Eugene Lee
(74) *Attorney, Agent, or Firm* — Nields, Lemack & Frame, LLC

(57) ABSTRACT

A method of isolating sections of the channel layer in a SOI workpiece is disclosed. Rather than etching material to create trenches, which are then filled with a dielectric material, ions are implanted into portions of the channel layer to transform these implanted regions from silicon or silicon germanium into an electrically insulating material. These ions may comprise at least one isolating species, such as oxygen, nitrogen, carbon or boron. This eliminates various processes from the fabrication sequence, including an etching process and a deposition process. Advantageously, this approach also results in greater axial strain in the channel layer, since the channel layer is continuous across the workpiece.

11 Claims, 9 Drawing Sheets

(56) References Cited

U.S. PATENT DOCUMENTS

| | | |
|---|---|---|
| 6,743,651 B2 | 6/2004 | Chu et al. |
| 6,846,727 B2 | 1/2005 | Fogel et al. |
| 6,855,994 B1 | 2/2005 | King et al. |
| 7,064,387 B2 * | 6/2006 | Jang ................ H01L 21/76264 |
| | | 257/349 |
| 7,192,840 B2 * | 3/2007 | Kanamori ......... H01L 21/76281 |
| | | 438/440 |
| 7,259,053 B2 * | 8/2007 | Kim ................ H01L 21/823878 |
| | | 438/231 |
| 7,394,111 B2 * | 7/2008 | Forbes ..................... C30B 1/023 |
| | | 257/191 |
| 7,479,423 B2 * | 1/2009 | Yagishita ............ H01L 27/1203 |
| | | 438/275 |
| 7,718,506 B2 * | 5/2010 | Zhang ............... H01L 21/76237 |
| | | 438/440 |
| 8,159,031 B2 * | 4/2012 | Dyer ................. H01L 21/76267 |
| | | 257/350 |
| 8,502,316 B2 * | 8/2013 | Fung ................. H01L 21/26506 |
| | | 257/350 |
| 8,759,213 B2 * | 6/2014 | Lavoie .............. H01L 21/76889 |
| | | 257/770 |
| 9,917,103 B1 | 3/2018 | Mulfinger et al. |
| 10,269,616 B2 * | 4/2019 | Yu ......................... H01L 21/762 |
| 2003/0102499 A1 * | 6/2003 | Fujiwara ........... H01L 29/78618 |
| | | 257/E29.147 |
| 2003/0186511 A1 * | 10/2003 | Yiu ....................... H01L 21/762 |
| | | 257/E21.556 |
| 2006/0194411 A1 | 8/2006 | Hargrove |
| 2009/0042357 A1 | 2/2009 | O'Connell et al. |
| 2009/0315115 A1 * | 12/2009 | Zhang ................ H01L 21/76224 |
| | | 257/E27.06 |
| 2012/0214289 A1 * | 8/2012 | Yin .................... H01L 21/76243 |
| | | 438/423 |
| 2012/0252180 A1 * | 10/2012 | Tomimatsu ......... H01L 27/1104 |
| | | 257/E21.409 |
| 2014/0054546 A1 * | 2/2014 | Liu ......................... H01L 29/78 |
| | | 438/283 |

* cited by examiner

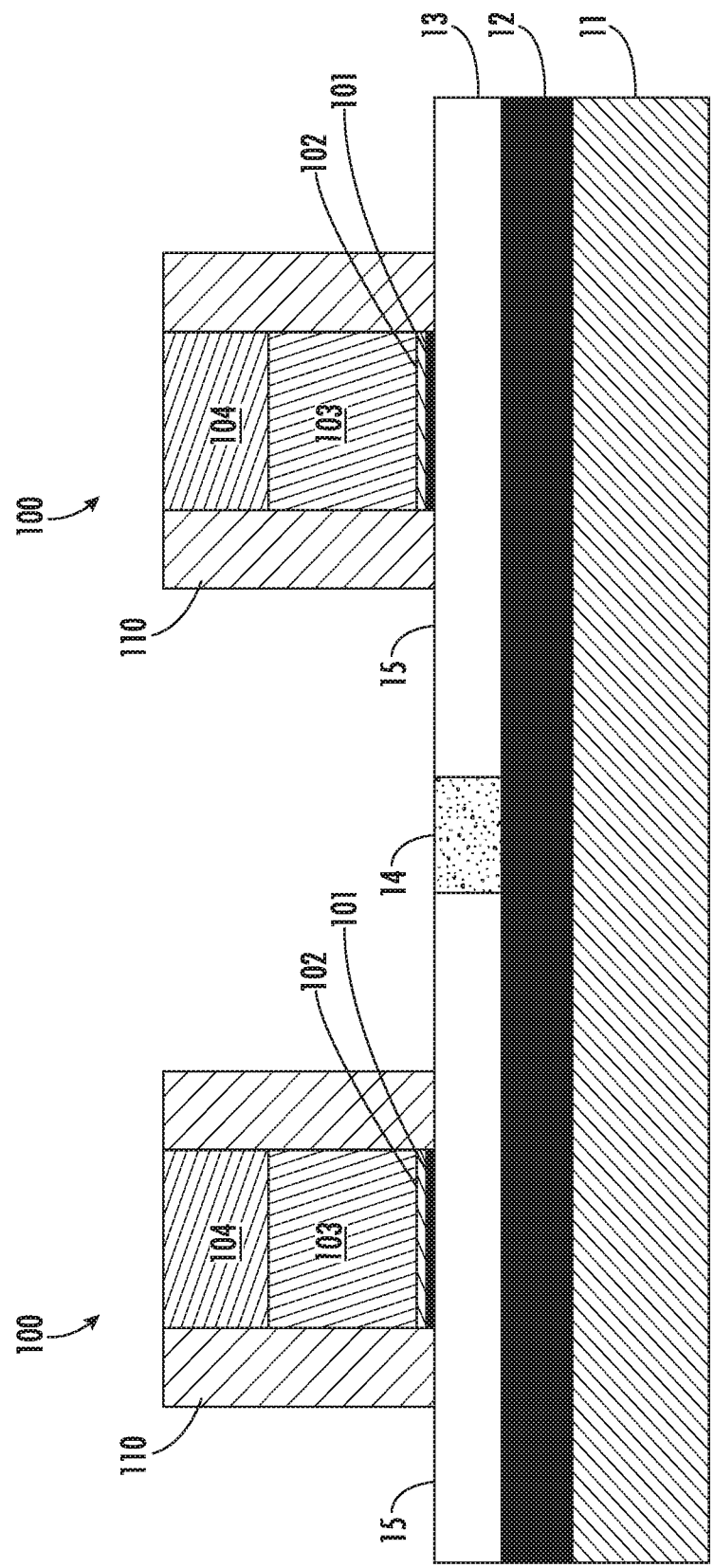

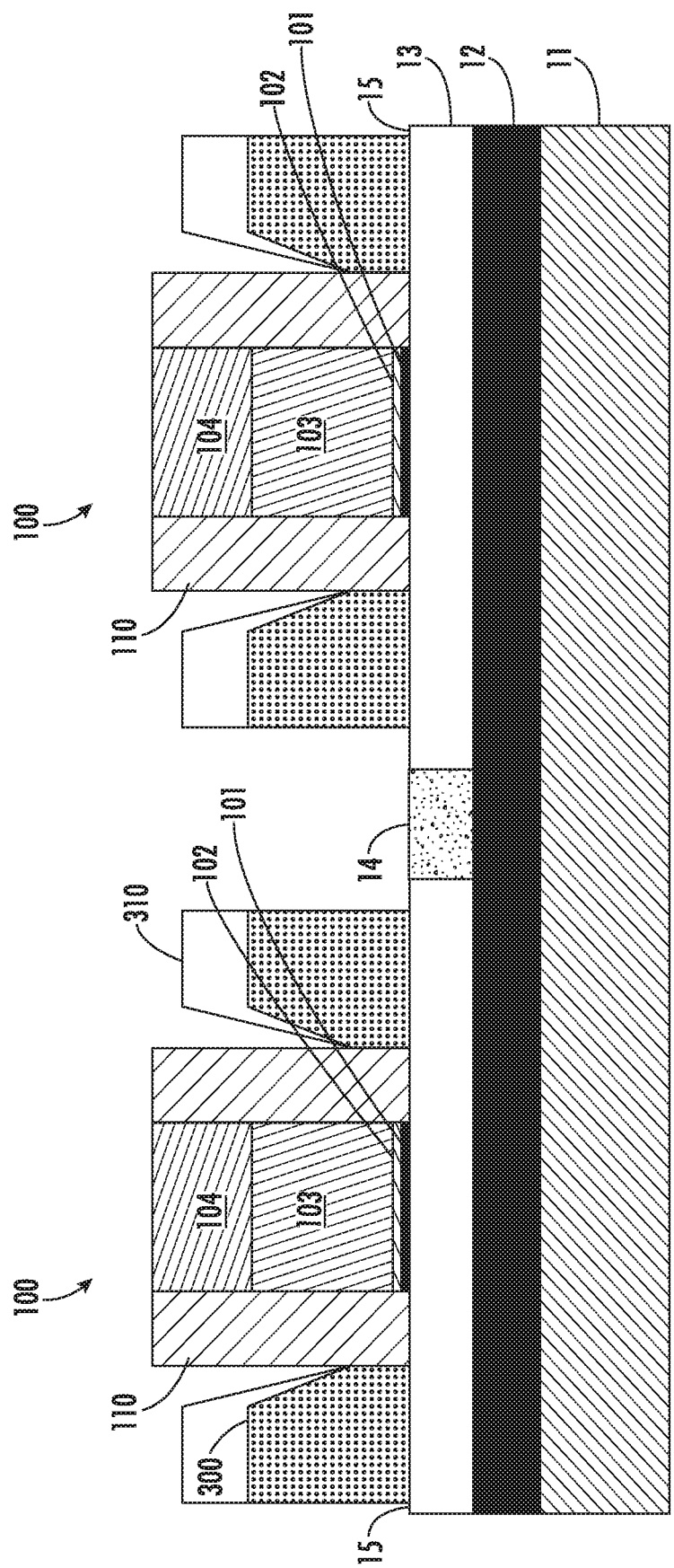

ISOLATION METHOD TO ENABLE CONTINUOUS CHANNEL LAYER

FIELD

Embodiments of this disclosure are directed to methods of creating isolation within a channel layer for Silicon on Insulator (SOI) devices, and more particularly for fully depleted silicon on insulator (FDSOI) technology.

BACKGROUND

As transistors continue to shrink in dimension, new approaches are being pursued. One such approach is referred to as fully depleted silicon on insulator (FDSOI). To create an FDSOI device, first a workpiece is prepared which has a bulk region, which may be an N-type ground plane. Disposed on top of the bulk region is a buried oxide (BOX) layer. The BOX layer may be silicon dioxide. Above the BOX layer is the channel layer. The channel layer may be silicon for N-type field effect transistor (NFET) devices and may be silicon-germanium for P-type field effect transistor (PFET) devices. The semiconductor device is created by forming source and drain regions on top of the channel layer. Further, between the source and drain regions, a gate is formed. The gate may include a high dielectric constant material disposed on the channel to form a Hi-K layer. A work function (WF) metal may be disposed on top of the Hi-K layer. Polysilicon may be grown on top of the WF metal.

Because the channel is very thin, such as 20 nanometers (nm) or less, the channel beneath the gate is not doped. However, the device performance is improved if there is axial stress in the channel.

Additionally, each section of the channel layer associated with a transistor is isolated from adjacent sections of the channel layer to reduce leakage current. This is typically done using shallow trench isolator (STI). In this technique, the channel layer is patterned, etched and filled with an oxide. These trenches physically and electrically separate the adjacent sections of the channel layer.

However, the stress in the channel layer is reduced by the creation of these trenches. Specifically, the exposed ends of the channel layer retract, and this results in a reduction in axial strain. It has been found that strain may be reduced by 0.4% to 0.8% proximate the trench. This reduction in axial strain leads to performance degradation, especially in smaller geometries.

Thus, it would be beneficial if there were a method to create isolation between devices on an SOI workpiece without the traditional reduction in axial strain. Further, it would be advantageous if this method simplifies the fabrication process.

SUMMARY

A method of isolating sections of the channel layer in a SOI workpiece is disclosed. Rather than etching material to create trenches, which are then filled with a dielectric material, ions are implanted into portions of the channel layer to transform these implanted regions from silicon or silicon germanium into an electrically insulating material. These ions may comprise at least one isolating species, such as oxygen, nitrogen, carbon or boron. This eliminates various processes from the fabrication sequence, including an etching process, a deposition process and a planarization process. Advantageously, this approach also results in greater axial strain in the channel layer, since the channel layer is continuous across the workpiece.

According to one embodiment, a method of forming a semiconductor device on a silicon on insulator (SOI) workpiece, wherein the SOI workpiece comprises a bulk region, a buried oxide (BOX) layer and a channel layer, is disclosed. The method comprises applying a mask over a portion of the workpiece; implanting ions comprising at least one isolating species into portions of the channel layer, to transform the portions of the channel layer into isolation areas, wherein the isolation areas electrically separate the channel layer into a plurality of channel sections; removing the mask; and fabricating the semiconductor device on one or more of the plurality of channel sections. In certain embodiments, the mask is applied prior to fabricating the semiconductor device. In some embodiments, the mask is applied after fabricating the semiconductor device. In certain embodiments, fabricating a semiconductor device comprises: forming a gate on the channel layer; and creating raised source and drain regions on both sides of the gate. In certain embodiments, the mask is applied and the ions comprising the at least one isolating species are implanted prior to forming the gate. In some embodiments, the mask is applied and the ions comprising the at least one isolating species are implanted after forming the gate. In certain embodiments, the mask is applied and the ions comprising the at least one isolating species are implanted after creating the raised source and drain regions. In certain embodiments, the channel layer comprises silicon, and the ions comprising the at least one isolating species comprise oxygen and the ions comprising the at least one isolating species transform portions of the channel layer into silicon dioxide. In some embodiments, the channel layer comprises silicon and germanium, and wherein the ions comprising the at least one isolating species comprise oxygen and the ions of the at least one isolating species transform portions of the channel layer into a mix of silicon dioxide and germanium dioxide. In some embodiments, the isolating species are selected from the group consisting of carbon, oxygen, nitrogen, and boron.

According to another embodiment, a semiconductor workpiece is disclosed. The semiconductor workpiece comprises a bulk region; a buried oxide (BOX) layer; and a channel layer; wherein the channel layer is physically continuous, and portions of the channel layer are implanted with ions to form isolation areas which electrically separate the channel layer into separate channel sections. In certain embodiments, the semiconductor workpiece comprises a semiconductor device fabricated on one of the channel sections. In certain embodiments, the channel layer comprises silicon and the isolation areas comprise silicon dioxide. In some embodiments, channel layer comprises silicon and the isolation areas comprise SiN, SiON, SiOC, SiCN, SiOCN or SiBCN. In certain embodiments, the channel layer comprises silicon and germanium, and wherein the isolation areas comprise a mix of silicon dioxide and germanium dioxide. In some embodiments, the semiconductor device comprises a gate and raised source and drain regions.

According to another embodiment, a method of forming a semiconductor workpiece is disclosed. The method comprises implanting ions comprising at least one isolating species into a semiconductor workpiece, wherein the semiconductor workpiece comprises a bulk region, a buried oxide layer and a channel layer and the ions are implanted into portions of the channel layer; wherein an amount of ions of the at least one isolating species that are implanted is sufficient such that the portions of the channel layer form isolating areas, so as electrically separate the channel layer into a plurality of channel sections. In certain embodiments, the ions are implanted with an implant energy of between 1 keV and 30 keV. In certain embodiments, the dose of ions is between 1E10 atoms/cm$^2$ and 1E15 atoms/cm$^2$. In some embodiments, the isolating species are selected from the group consisting of oxygen, nitrogen, and carbon and boron.

BRIEF DESCRIPTION OF THE FIGURES

For a better understanding of the present disclosure, reference is made to the accompanying drawings, which are incorporated herein by reference and in which:

FIGS. 1A-1G show a fabrication sequence according to one embodiment;

DETAILED DESCRIPTION

As noted above, FDSOI is being pursued as a technique to fabricate smaller transistors. Fully depleted SOI implies that the channel layer is not doped. Rather, the thinness of the channel layer allows the transistor to transport carriers (either electrons or holes). Axial strain, such as a compressive strain, may be beneficial to improve the ability of the device to transport these carriers, and especially holes.

However, as described above, the formation of trenches, which are used for isolation between adjacent devices on the workpiece, may reduce axial strain.

FIGS. 1A-1G show a fabrication sequence according to one embodiment which creates the electrical isolation in the channel layer without sacrificing axial strain. FIG. 2 shows a flowchart that corresponds to FIGS. 1A-1G.

Figure 1A:
Figure 2:
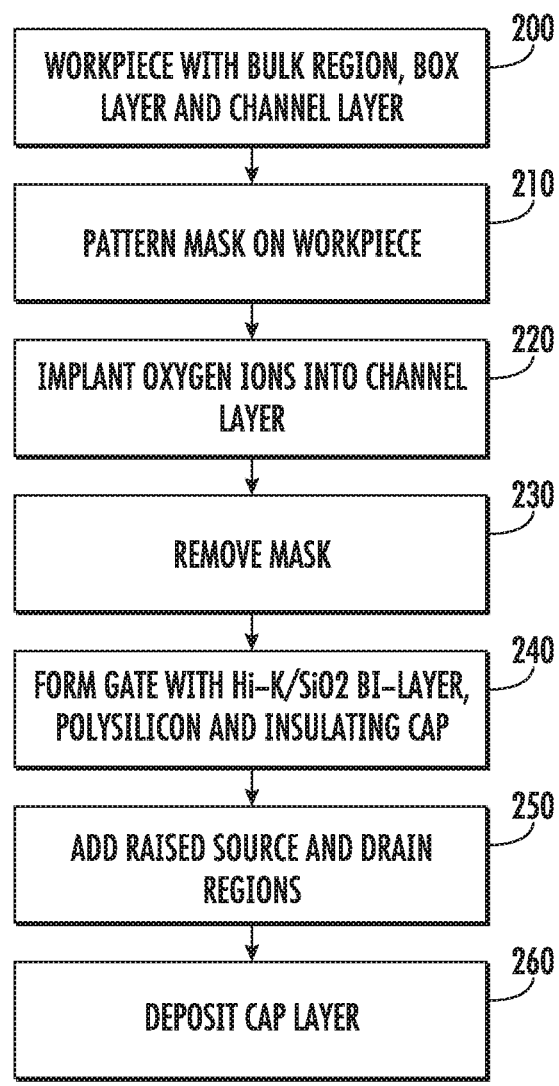
FIG. 2 shows a flowchart for creating devices on a FDSOI workpiece according to one embodiment.

FIG. 1A shows the workpiece 10 prior to the formation of the devices. Specifically, the workpiece 10 is a SOI workpiece and comprises a bulk region 11, which may be an N-type ground plane. This bulk region 11 may be silicon that is doped with phosphorus, arsenic or another suitable species.

Disposed above the bulk region 11 is a buried oxide layer, or BOX layer 12. The BOX layer 12 may comprise a layer of silicon dioxide with a thickness of 10 nm-200 nm. In certain embodiments, the thickness of the BOX layer 12 is about 25 nm.

Finally, a channel layer 13 is disposed above the BOX layer 12. For a NFET device, the channel layer 13 may be silicon. For a PFET device, the channel layer 13 may be SiGe, where up to 35% of the material in the channel layer 13 comprises germanium. The doping of the channel layer 13 may be achieved using germanium condensation or another suitable process.

Germanium condensation includes the deposition of a germanium layer on top of a silicon channel layer. During a long duration, high temperature anneal process, germanium diffuses into the channel layer 13, such that up to about 35% of the channel layer 13 comprises germanium.

In other embodiments, the entire channel layer 13 may be silicon.

The channel layer 13 may have a thickness of up to 80 nm. In certain embodiments, the thickness of the channel layer 13 may be between 8 nm and 20 nm.

Thus, the fabrication process begins with a workpiece 10 having a bulk region 11, a BOX layer 12 and a channel layer 13, as shown in Box 200 of FIG. 2.

Figure 1B:
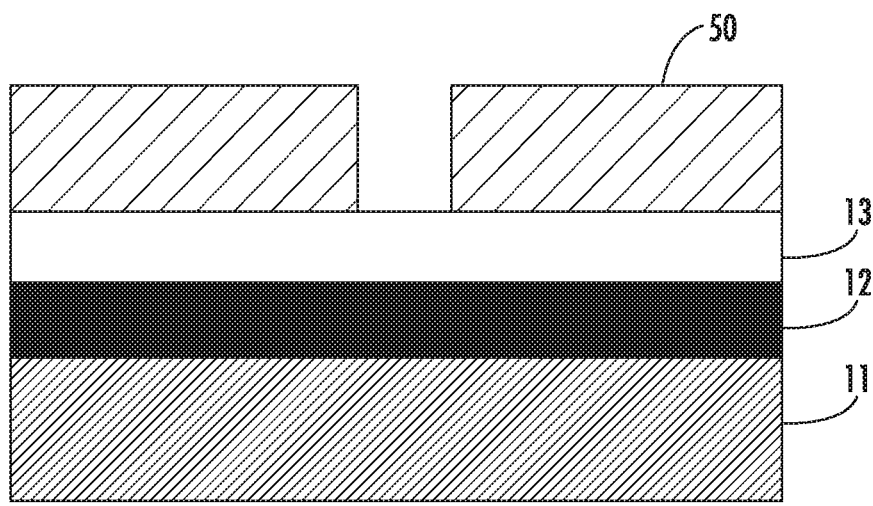

As shown in Box 210 of FIG. 2 and in FIG. 1B, a mask 50 is disposed on portions of the workpiece 10. Specifically, the mask 50 is patterned such that the portions of the channel layer 13 that are intended to be isolation areas are exposed. These isolation areas are typically disposed between adjacent transistor devices. The mask 50 may be any material commonly used as mask material, such as, but not limited to photopolymeric, photodecomposing, and photocrosslinking photoresists.

Figure 1C:
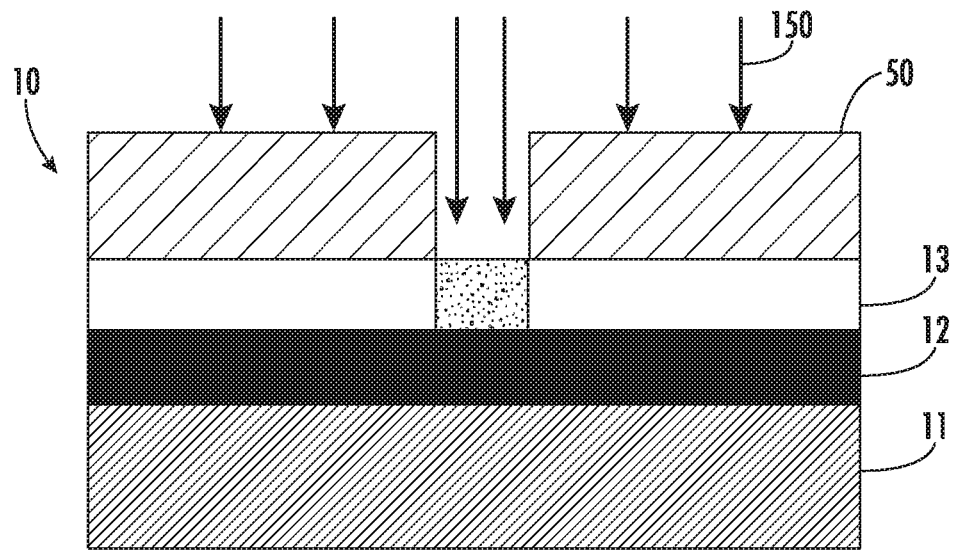

Next as shown in Box 220 of FIG. 2 and in FIG. 1C, ions comprising at least one isolating species, such as oxygen ions 150, are implanted into the channel layer 13. A sufficient amount of oxygen ions 150 are implanted so as to transform the implanted regions of the channel layer 13 into an insulating material.

The implant may be performed in a variety of manners. In one embodiment, a beam line ion implantation system may be used. The beam line ion implantation system typically comprises an ion source, extraction optics, a mass analyzer and mass resolving aperture, a collimator, and acceleration and deceleration stages. The beam line ion implantation system may utilize a ribbon ion beam or a scanned ion beam. Feed gas may be introduced into the ion source. Ions are attracted through the extraction aperture of the ion source by negatively biasing the extraction optics. These ions are directed through the mass analyzer, wherein ions of different mass/charge ratios travel through different paths. The ions of the desired species and charge pass through the mass resolving aperture and may be accelerated or decelerated. Further, in certain embodiments, an electrostatic scanner may be used to create a scanned ion beam from a spot ion beam. A collimator may then be used to create a plurality of parallel beamlets that impact the workpiece.

In another embodiment, a plasma chamber may be used, wherein the workpiece is disposed in the plasma chamber. In this embodiment, feed gas may be introduced into the plasma chamber. The feed gas may be energized into a plasma using a RF antenna disposed proximate the plasma chamber. The ions may then be accelerated toward the workpiece by applying a negative bias to the workpiece.

Figure 3:
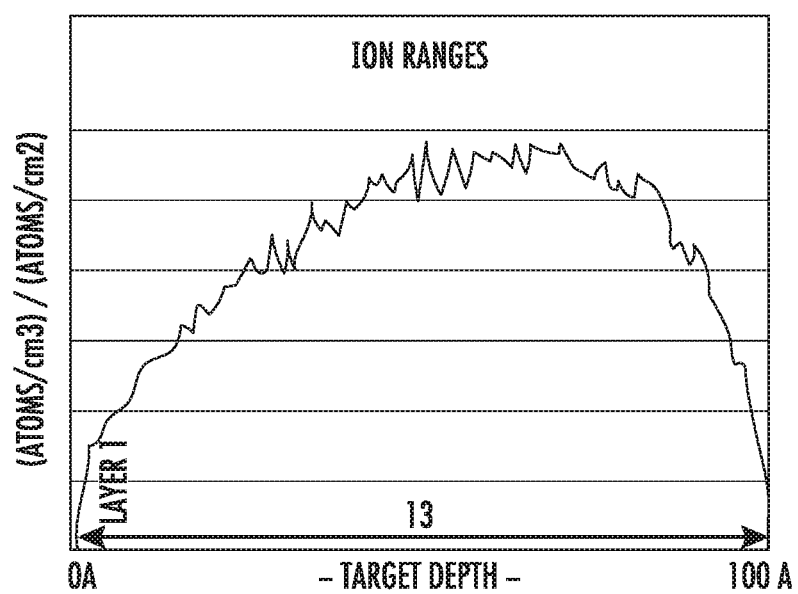
FIG. 3 shows the simulated ion distribution of the implant shown in FIG. 1C.

In certain embodiments, the oxygen ions may be implanted using an implant energy of about between 1 keV and 30 keV. The dose may be between 1E10 and 1E15 atoms/cm$^2$. In one particular embodiment, the oxygen ions may be implanted using an implant energy of about 3 keV and a dose of about 1.3E12 atoms/cm$^2$ FIG. 3 shows a simulation in which the thickness of the channel layer 13 is assumed to be 10 nm. Oxygen ions 150 are implanted at an implant energy of 3 Kev. Note that the majority of oxygen ions 150 are implanted into the channel layer 13. After a thermal treatment, the implanted portions of the channel layer 13 will become an insulating material. Specifically, in regions where the channel layer 13 comprises silicon, the implanted regions will become silicon dioxide ($SiO_2$). In regions where the channel layer 13 comprises SiGe, the implanted regions will become a mix of germanium dioxide and silicon dioxide. Thus, the implanted regions become isolation areas 14.

Note that the implant is intended to create isolation in the lateral direction. In other words, the isolation is created by isolation areas 14 formed in the same layer, specifically the channel layer 13.

Figure 1D:
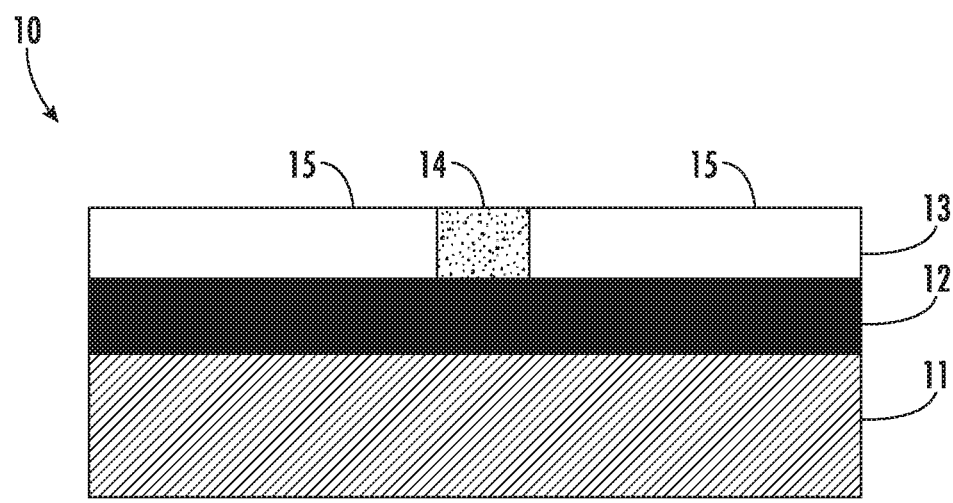

Following the implant, the mask 50 can be removed, as shown in Box 230 of FIG. 2 and in FIG. 1D. Notably, a dedicated thermal treatment may not be performed at this time, as there are subsequent thermal treatments in the fabrication process which may serve to anneal the implanted portions of the channel layer 13. Thus, when the mask 50 is removed, the channel layer 13 now includes isolation areas 14. In other words, the workpiece 10 comprises a continuous channel layer 13, wherein portions of that channel layer 13 have been implanted to become isolation areas 14 without any physical discontinuities on the channel layer 13. The isolation areas 14 allow the creation of separate channel sections 15. The isolation areas 14 prevent electric current leakage between these channel sections 15. Various kinds of semiconductor devices may be fabricated on each channel section, including, for example, logic circuits, memory cells, resistors, capacitors, and input/output (I/O) devices.

Thus, the isolation areas 14 do not physically separate the channel layer 13, but do electrically separate the channel layer 13 into a plurality of channel sections 15.

This differs from traditional shallow trench isolation (STI), where the channel layer is physically cut to create a plurality of physically and electrically separate channel sections. Note that the workpiece 10 in FIG. 1D does not have any added structures in the workpiece 10 itself. There are no trenches and the BOX layer 12 is not etched or otherwise modified by the sequence shown in FIGS. 1B-1D.

In one embodiment, as shown in Box 240 of FIG. 2 and in FIG. 1E, the gate 100 is formed next on each channel section 15. To create the gate 100, the workpiece 10 may be patterned. For example, a mask may be disposed on those portions of the workpiece where the gate 100 is not to be formed.

First, a high dielectric constant material is applied to the top surface of the channel layer 13 to form a Hi-K/SiO$_2$ bi-layer 101. The typical thickness of this bi-layer may be 1 nm to 5 nm and 0.5 nm to 2 nm of Hi-K and SiO$_2$, respectively. The high dielectric constant materials include, but are not limited to, HfO$_2$, HfSiO, HfSiON, Zro$_2$, La$_2$O$_3$, Al$_2$O$_3$, TiO$_2$, SrTiO$_3$, Y$_2$O$_3$, HfO$_x$N$_y$, ZrO$_x$N$_y$, Al$_2$O$_x$N$_y$, and TiO$_x$N$_y$. In certain embodiments, the value of x is between 0.5 to 3 and is independent of y, while the value of y is between 0 to 2 and is independent of x.

A work function (WF) metal 102 is then formed on the Hi-K/SiO$_2$ bi-layer 101. This WF metal 102 may be TiN, TaN, TaAlN, or another material in some embodiments. The WF metal 102 may be between 2 nm and 15 nm, based on threshold voltage tuning. Of course, other thicknesses are also possible. A polysilicon layer 103 may then be disposed on top of the WF metal 102. The polysilicon layer 103 may be between 30 nm and 60 nm, although other thicknesses are possible. An insulating cap layer 104, such as a silicon nitride cap, is then disposed on the polysilicon layer 103. The insulating cap layer 104 may be between 5 nm and 20 nm, although other thicknesses are also possible.

The Hi-K/SiO$_2$ bi-layer 101, the WF metal 102, the polysilicon layer 103 and the insulating cap layer 104 may be formed using suitable deposition processes such as, but not limited to, sub-atmosphere pressure chemical vapor deposition (SACVD), low-pressure chemical vapor deposition (LPCVD), plasma-enhanced CVD (PECVD), atomic layer deposition (ALD), and sputtering.

The Hi-K/SiO$_2$ bi-layer 101, the WF metal 102, the polysilicon layer 103 and the insulating cap layer 104 form the gate 100. Additionally, spacers 110 are disposed on either side of the gate 100. The spacers 110 may be created using chemical vapor deposition (CVD), plasma enhanced chemical vapor deposition (PECVD), atomic layer deposition (ALD), sputtering, or other processes. The spacers 110 may comprise a dielectric material, such as, but are not limited to, silicon boron carbon nitride (SiBCN), SiOCN, SiCOH, SiCN, and SiON dielectric materials. The spacers 110 may be as tall as the gate 100. The width of the spacers 110 may be between 2 and 50 nm. The spacers 110 are used to physically separate the gate 100 from the raised source and drain regions 300.

Figure 1F:
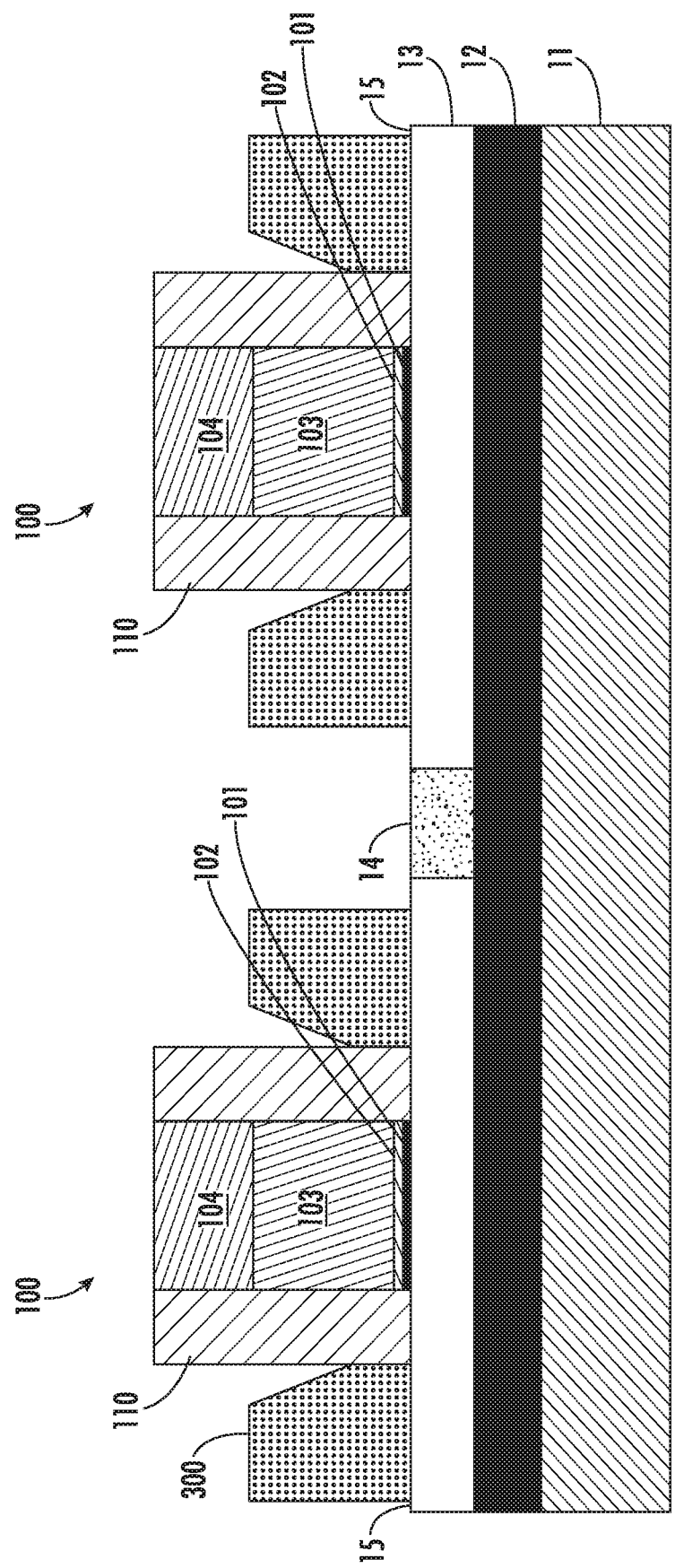

As shown in Box 250 of FIG. 2 and in FIG. 1F, the raised source and drain regions 300 are added. The raised source and drain regions 300 may be created through an in-situ doped epitaxial growth process. The epitaxial process may introduce a silicon-containing gas and a germanium containing gas in a chamber containing the workpiece 10. The concentration of germanium in the raised source and drain regions 300 may be between 30% and 40%. In some embodiments, the height of the raised source and drain regions 300 may be about 30 nm. The raised source and drain regions 300 may be constructed of other materials, if desired.

As shown in Box 260 of FIG. 2 and in FIG. 1G, a cap layer 310 may be applied on top of the raised source and drain regions 300. The cap layer 310 may be silicon nitride and may be formed using a CVD process. The thickness of the cap layer 310 may be between 5 and 100 nm. The cap layer 310 may serve to protect the device from downstream etching or cleaning processes. This may also further isolate the gate 100.

Subsequent to this, traditional processes may be performed, such as interlayer dielectric (ILD) deposition, of materials such as SiO2, low-K materials, and others; chemical mechanical planarization (CMP); middle of line (MOL) contact formation and back end of line (BOEL) processing. Note that there may be thermal treatments performed during these processes, which also serve to anneal the implanted regions of the channel layer 13.

There are several modifications that may be made to this fabrication process.

Figure 4:
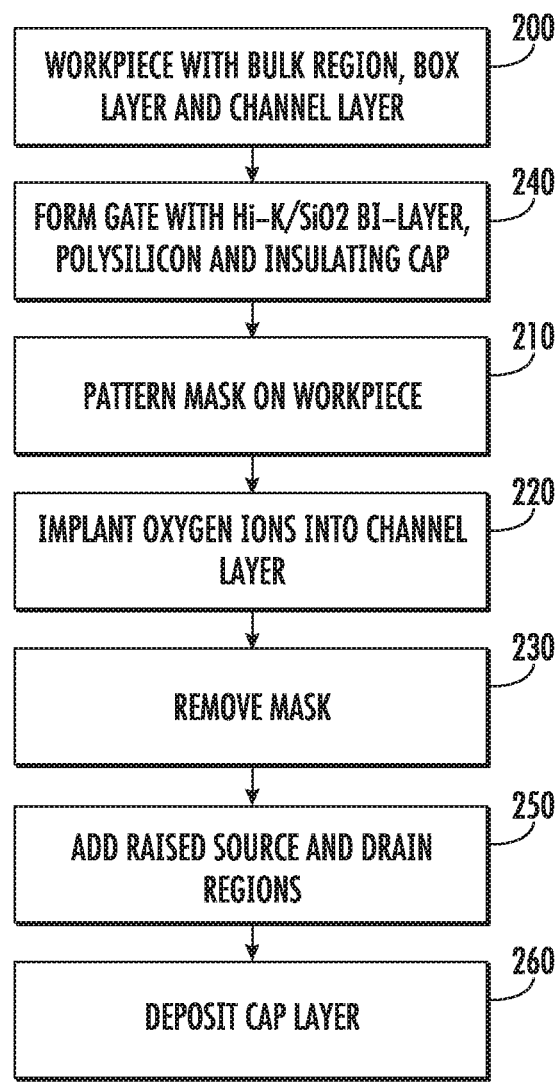
FIG. 4 shows a flowchart for creating devices on a FDSOI workpiece according to a second embodiment.

For example, the creation of the isolation areas 14 may occur at other points during the fabrication process. For example, the implant of oxygen ions 150 may occur after the formation of the gate 100. The remainder of the process is as described above. This fabrication process is shown in FIG. 4.

Figure 5:
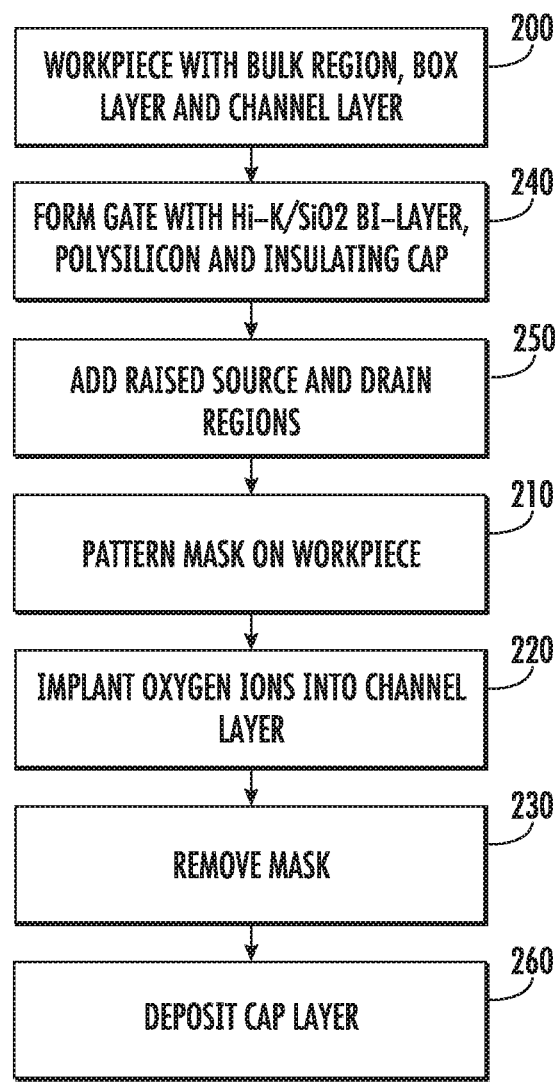
FIG. 5 shows a flowchart for creating devices on a FDSOI workpiece according to a third embodiment.

In another embodiment, the implant of the oxygen ions 150 may occur after the raised source and drain regions 300 are created. The remainder of the process is as described above. This fabrication process is shown in FIG. 5.

In yet another embodiment, a thermal treatment may be performed immediately after the implanting of the oxygen ions 150 to anneal the implanted portions of the channel layer 13.

Further, while FIGS. 1E-1G and FIGS. 2-5 show the formation of transistors on each channel section 15, other embodiments are possible. For example, memory cells, I/O devices, resistors, diodes, or capacitors may also be fabricated on each channel section 15. For example, Boxes 240-260 may be replaced with processes that are used for the specific semiconductor device that is being formed on the channel section 15.

Although the above description describes the use of oxygen ions 150, other species may also be utilized. For example, nitrogen ions may be used in lieu of oxygen ions to create isolation areas 14 made of SiN. Alternatively, nitrogen ions may be implanted with the oxygen ions 150, either simultaneously or sequentially, to create isolation areas 14 made of SiON. In another embodiment, carbon ions may be implanted with the oxygen ions 150, either simultaneously or sequentially, to create isolation areas 14 made of SiOC. In another embodiment, carbon ions and nitrogen ions may be implanted with the oxygen ions 150, either simultaneously or sequentially, to create isolation areas 14 made of SiOCN. In another embodiment, carbon ions and nitrogen ions may be implanted in lieu of the oxygen ions 150, either simultaneously or sequentially, to create isolation areas 14 made of SiCN. In another embodiment, carbon ions, boron ions and nitrogen ions may be implanted in lieu of the oxygen ions 150, either simultaneously or sequentially, to create isolation areas 14 made of SiBCN. Each of these species; oxygen, carbon, boron and nitrogen; may be referred to as isolating species, as each of them, when implanted into silicon, transforms the channel layer 13 into a dielectric material which isolates channel sections 15.

The system and method described herein have many advantages. First, the disclosed method eliminates the etching process that is typically used to create the trenches. Additionally, the deposition process used to fill these trenches and the subsequent planarization process may also be eliminated. In addition to the simplification of the fabrication process, the method disclosed herein also improves the axial strain of the channel layer 13, since there are no discontinuities or trenches in this layer. This improvement may be between 0.4% and 0.8% in certain embodiments.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of forming a semiconductor device on a silicon on insulator (SOI) workpiece, wherein the SOI workpiece comprises a bulk region, a buried oxide (BOX) layer and a channel layer, wherein the channel layer has a thickness of 80 nm or less, the method comprising:
    applying a mask over a portion of the workpiece;
    implanting ions comprising at least one isolating species into portions of the channel layer, wherein the channel layer is a top layer of the SOI workpiece when the ions are being implanted, wherein ion implantation is used to transform the portions of the channel layer into isolation areas, and wherein the isolation areas electrically separate the channel layer into a plurality of channel sections;
    removing the mask;
    fabricating the semiconductor device on one or more of the plurality of channel sections; and
    performing a thermal treatment after or while fabricating the semiconductor device, wherein no thermal treatment is performed prior to the fabricating and wherein the thermal treatment also serves to anneal implanted regions in the channel layer.

2. The method of claim 1, wherein the mask is applied prior to fabricating the semiconductor device.

3. The method of claim 1, wherein fabricating a semiconductor device comprises:
    forming a gate on the channel layer; and
    creating raised source and drain regions on both sides of the gate.

4. The method of claim 3, wherein the mask is applied and the ions comprising the at least one isolating species are implanted prior to forming the gate.

5. The method of claim 1, wherein the channel layer comprises silicon, and the ions comprising the at least one isolating species comprise oxygen and the ions comprising the at least one isolating species transform portions of the channel layer into silicon dioxide.

6. The method of claim 1, wherein the channel layer comprises silicon and germanium, and wherein the ions comprising the at least one isolating species comprise oxygen and the ions comprising the at least one isolating species transform portions of the channel layer into a mix of silicon dioxide and germanium dioxide.

7. The method of claim 1, wherein the isolating species are selected from the group consisting of carbon, oxygen, nitrogen, and boron.

8. The method of claim 1, wherein the channel layer comprises silicon and the isolation areas comprise SiN, SiON, SiOC, SiCN, SiOCN or SiBCN.

9. The method of claim 1, wherein there are at least two isolating species and at least one of the at least two isolating species is carbon or boron.

10. The method of claim 1, wherein the ions are implanted with an implant energy of between 1 keV and 30 keV, and the implant energy is selected such that a majority of the ions are implanted in the channel layer.

11. The method of claim 1, wherein a dose of ions is between 1E10 atoms/cm$^2$ and 1E15 atoms/cm$^2$.

* * * * *